US006589884B1

(12) United States Patent
Torek

(10) Patent No.: US 6,589,884 B1
(45) Date of Patent: Jul. 8, 2003

(54) METHOD OF FORMING AN INSET IN A TUNGSTEN SILICIDE LAYER IN A TRANSISTOR GATE STACK

(75) Inventor: Kevin J. Torek, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,990

(22) Filed: Aug. 31, 2000

(51) Int. Cl.[7] .................. H01L 21/302; H01L 21/461
(52) U.S. Cl. .................. 438/755; 438/754; 134/1.3; 134/2; 252/79.3; 252/79.2
(58) Field of Search .................. 438/670, 755, 438/669, 754; 134/1.2, 1.3, 2, 3; 252/79.3, 79.1, 79.2, 79.4, 79.5

(56) References Cited

U.S. PATENT DOCUMENTS

| 5,211,807 A | * | 5/1993 | Yee ........................... 156/664 |
| 5,685,951 A | | 11/1997 | Torek et al. ............. 156/646.1 |
| 5,783,495 A | | 7/1998 | Li et al. ..................... 438/738 |
| 5,879,974 A | * | 3/1999 | Yamazaki ................... 438/162 |
| 5,885,903 A | | 3/1999 | Torek et al. ................ 438/756 |
| 5,981,401 A | | 11/1999 | Torek et al. ................ 438/745 |
| 5,990,019 A | | 11/1999 | Torek et al. ................ 438/723 |
| 6,087,273 A | | 7/2000 | Torek et al. ................ 438/756 |
| 6,090,683 A | | 7/2000 | Torek ......................... 438/424 |
| 6,103,637 A | | 8/2000 | Torek et al. ................ 438/745 |
| 6,232,228 B1 | * | 5/2001 | Kwag et al. ................ 438/669 |
| 6,358,788 B1 | * | 3/2002 | Chen et al. ................. 438/238 |

FOREIGN PATENT DOCUMENTS

WO          99/46808          9/1999          ......... H01L/21/027

* cited by examiner

Primary Examiner—Caridad Everhart
(74) Attorney, Agent, or Firm—Whyte Hirschboeck Dudek SC

(57) ABSTRACT

The invention relates to the fabrication of a gate stack or other layered structure in a semiconductor device, and more particularly to methods to selectively etch a metal silicide layer, such as tungsten silicide ($WSi_x$), without etching excessive amounts of an underlying polysilicon or gate dielectric layer. The methods of the invention employ an etch chemistry that minimizes or eliminates the formation of lateral growth structures on a metal silicide layer during oxidation steps following etch of a gate stack. A preferred etch composition comprises ammonium fluoride and less than 2% by volume hydrogen peroxide in an aqueous solution with a pH control agent to maintain the solution at about pH 7 to 10.

80 Claims, 3 Drawing Sheets

METHOD OF FORMING AN INSET IN A TUNGSTEN SILICIDE LAYER IN A TRANSISTOR GATE STACK

FIELD OF THE INVENTION

The present invention relates to processing methods in semiconductor device fabrication, and more particularly, to a method of etching a metal silicide layer without etching excessive amounts of other component layers in a gate stack or other layered structure.

BACKGROUND OF THE INVENTION

The operating speed of semiconductor devices depends primarily on the resistivity of the conductive material used to transmit signals from one circuit component to another. In semiconductor fabrication, tungsten silicide ($WSi_x$) has developed as a leading low-resistivity conductive layer for improved conductivity in wordlines and other conductors in memory devices. Other metal suicides used in gate stacks include cobalt silicide ($CoSi_x$), molybdenum silicide ($MoSi_x$), and titanium silicide ($TiSi_x$).

FIG. 1 illustrates a wafer fragment 10 with an exemplary conventional gate stack structure 12, after etching, disposed on a silicon substrate 14. As shown, the layered gate stack 12 includes a gate dielectric layer 16 such as silicon dioxide ($SiO_2$) formed on the silicon substrate 14, a doped polysilicon layer 18, a metal silicide layer 20, a tungsten nitride barrier layer 22, a tungsten layer 24, a low silane oxide (LSO) layer 26, a nitride cap layer 28, and an anti-reflective coating (ARC) layer 30. After the gate etch, a short oxidation step is then performed to oxidize the silicon surface 14 to heal damage caused by the etch. The oxidation also eliminates sharp corners of the etched polysilicon gate layer 18 to eliminate potential leakage, commonly referred to as "smiling the gate." Thereafter, a dopant implantation is performed to form the source/drain (S/D) regions 34a–b in the silicon substrate 14.

A drawback of metal suicides is that they are prone to oxidization. Consequently during the oxidation step, the metal silicide is also oxidized. This can cause undesirable lateral growth of the metal silicide, resulting in formation that is commonly termed "mouse ears" 36 on the sidewalls 32b of the metal silicide layer 20, as shown in FIG. 2. Such lateral growth can interfere with a subsequent ion implantation step to form the source/drain (S/D) regions 34a–b, thus creating processing problems.

Therefore, it would be advantageous to develop a technique that minimizes or eliminates the effect of lateral growth (i.e., mouse ears) of a metal silicide layer during semiconductor fabrication.

SUMMARY OF THE INVENTION

The invention provides an etch solution and methods for selectively etching the metal silicide layer of a gate stack or other layered structure in the fabrication of a semiconductor device, without substantially etching the other component layers of the structure.

The etch solution according to the invention comprises one or more fluorine-comprising compounds and one or more oxidizing agents, with a pH control agent to maintain the solution at a pH of about 7 to about 10. The etch solution includes the fluorine compound and oxidizer in amounts effective to selectively etch metal silicide at a rate exceeding that of polysilicon and oxides, preferably at an etch rate about 2 to about 10 times higher. A preferred etch solution to etch a tungsten silicide layer comprises an effective amount of ammonium fluoride ($NH_4F$) and less than about 2% by volume hydrogen peroxide ($H_2O_2$), with an amount of ammonium hydroxide ($NH_4OH$) to increase the pH to about 7 to about 10, preferably about pH 8 to about 9, whereby oxides and polysilicon components are not substantially etched.

The methods of the invention can be used to selectively remove a thickness of a blanket layer of metal silicide, or a portion of a layer of metal silicide interposed between layers in a multilayered structure to form an inset or recessed structure in the layer.

In one embodiment, the method is used in forming a gate stack comprising a layer of metal silicide. The metal silicide gate layer is selectively etched to form an inset into the layer, whereby other component layers are not substantially etched. In a subsequent oxidation step, the metal silicide will undergo oxidation whereby the inset is filled with oxide, resulting in a sidewall that is flush with the sidewalls of the other layers of the gate structure. Thus, the method is useful for minimizing or eliminating the formation of "mouse ears" on the exposed surface of a metal silicide gate layer during oxidation of the source/drain regions.

In another embodiment, the method is used for reducing the thickness of a blanket layer of metal silicide. Using the etch chemistry of the invention, the metal silicide is selectively etched to remove a portion of the layer and decrease its thickness. The method is useful, for example, in a process that utilizes an oxidation step on a substrate that includes a metal silicide layer; the metal silicide layer will undergo oxidation resulting in an increase in the thickness of the layer.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

Figure 1:
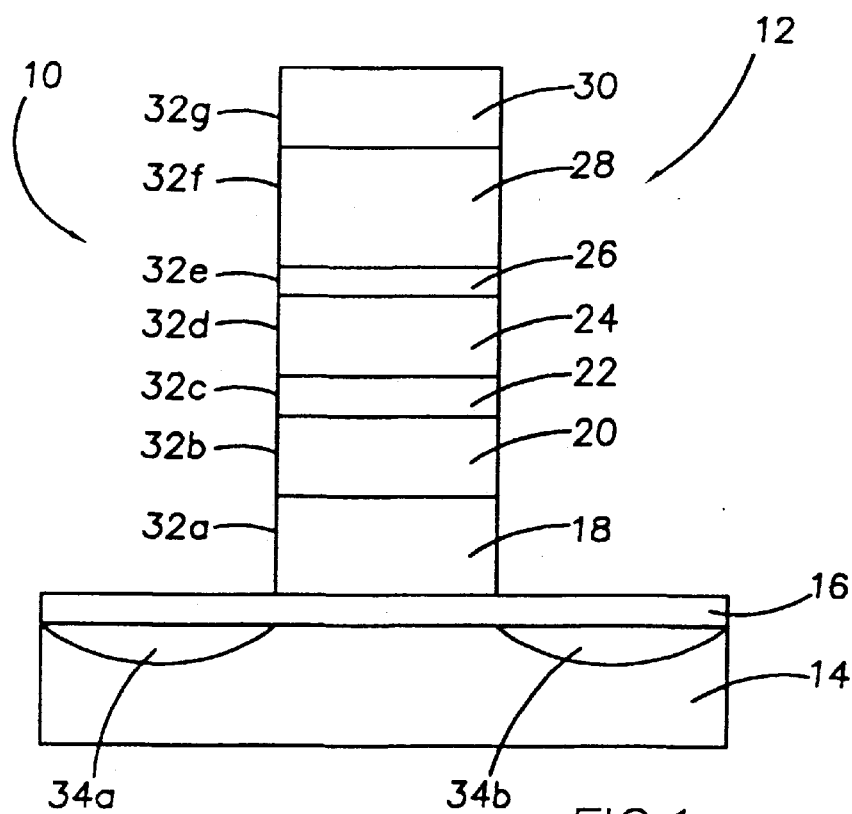
FIG. 1 is a side cross-sectional view of a prior art gate stack formation at a preliminary step of a processing sequence.

The present invention provides an etch solution and methods for selectively removing a metal silicide (e.g., tungsten silicide) material in the presence of polysilicon and/or oxide materials, in the fabrication of semiconductor devices. The invention particularly enables the use of tungsten silicide in a tungsten gate stack to achieve known transistor performance together with the lower resistance of tungsten.

The etch solution and method of the invention will be described generally with reference to the drawings for the purpose of illustrating the present preferred embodiments of the invention only and not for purposes of limiting the same. The figures illustrate processing steps for use in the fabrication of semiconductor devices in accordance with the present invention. It should be readily apparent that the processing steps are only a portion of the entire fabrication process.

The etch solution chemistry according to the invention if formulated to selectively etch a metal silicide layer without substantially etching polysilicon and/or oxides. The solution includes one or more fluorine-comprising compounds, one or more oxidizers, and one or more pH control agents. The relative amounts of the fluorine compound and the oxidizer are balanced so as to provide selective etching of a metal silicide layer, such as tungsten silicide layer, whereby the metal silicide layer is etched at a rate exceeding the rate of polysilicon and oxides, which are not substantially etched. Preferably, the etch solution etches the metal silicide at an etch rate of about 2 to about 10 times the etch rate of an oxide and/or polysilicon, or higher. Thus, the etch solution is formulated such that the relative amounts of the fluorine compound and the oxidizer will etch metal silicide at a faster rate than oxides or polysilicon. The pH of the solution is also be optimized so as to provide for selective etching of metal silicide (e.g., tungsten silicide) at substantially higher rates than oxides or polysilicon.

The fluorine-comprising compound is included in the solution in a major amount to effect etching of the metal silicide. The fluorine-comprising compound is preferably included in the solution in an amount of about 85% to about 99% by volume of the solution, preferably about 90% to about 95% by volume. Examples of useful fluorine-comprising compounds include ammonium fluoride ($NH_4F$), ammonium bifluoride ($NH_4HF_2$), and fluorides having the general formula $R_AN_BF_C$ where $R=(C_xH_y)_z$. Preferably, the RNF compound provides high selectivity to doped oxide (e.g., tungsten silicide etch: doped oxide etch>10). A preferred fluorine-comprising compound is ammonium fluoride ($NH_4F$).

The oxidizer is preferably included in the solution in an amount of about 0.001% up to about 2% by volume of the solution, to maintain a slow rate of etch of the metal silicide and inhibit etching of polysilicon and oxide components. A preferred oxidizer is hydrogen peroxide ($H_2O_2$), included in the solution at less than about 2% by volume. Other oxidizers that can be used include, for example, ozone ($O_3$), ammonium persulfate (($NH_4$)$_2S_2O_8$), potassium iodate ($KIO_3$), potassium permanganate ($KMnO_4$), nitric acid ($HNO_3$), sulfuric acid ($H_2SO_4$), ammonium nitrate $NH_4NO_3$), and ceric ammonium nitrate ($Ce(NH_4)_2(NO_3)_6$), among others, and mixtures thereof.

The etch solution is maintained at a pH in the range of about 7 to about 10, but the pH of the solution is optimally in the range of about 8 to about 9. One or more pH control agents or modifiers can be used, as known in the art, to adjust the pH of the etch solution to a desired level. Preferably, the pH control agent will adjust the pH of the solution to a desirable range or point for etching the metal silicide without significantly etching oxide layers (e.g., silicon dioxide ($SiO_2$)) or the polysilicon layer. The pH level can be manipulated by varying the strength of the base that is used to prepare the etch solution, and/or by the addition of an acid such as hydrochloric acid, sulfuric acid, nitric acid, and phosphoric acid, among others. Examples of useful bases include ammonium hydroxide ($NH_4OH$), tetramethylammonium hydroxide (($CH_3$)$_4NOH$), and bases having the general formula R—NOH where $R=(C_2H_y)_z$.

The etch solution can further include one or more stabilizers such as a neutral salt, and/or compatible surfactants, as desired.

In another aspect, the invention provides methods for selectively etching a metallic silicide material. A first embodiment of a method of the present invention is described with reference to FIGS. 3A–3B, in a method of forming a transistor gate stack 12'. The method will be described with reference to the etched gate stack 12 depicted in FIG. 1, which has been etched to expose the sidewall surfaces 32a–g of the component layers 18–30. In a conventional processing, an oxidation step is performed to oxidize the silicon surface 14 and to seal the sidewall surface 32a of the etched polysilicon gate layer 18. The method of the invention is employed prior to the oxidation step to eliminate unwanted lateral growth 36 of the metal silicide during the oxidation step.

Figure 3A:
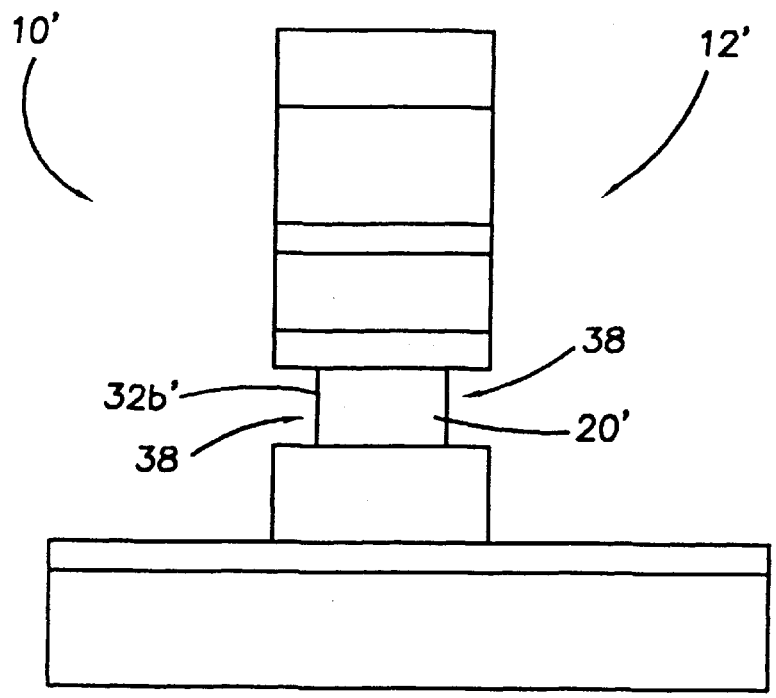
FIGS. 3A–3B are views of the gate stack of FIG. 1 at subsequent and sequential processing steps according to an embodiment of a method of the invention.

As shown in FIG. 3A, the gate stack 12' is subjected to an etch using the aqueous etch solution of the invention to remove a portion of the metal silicide layer 20' along the sidewall 32b' to form inset (recess) 38. The etch solution can be applied, for example, using a conventional temperature-controlled, shower or other spray mechanism, or by submersing or dipping the wafer or other substrate into a bath, for example, a conventional recirculating isothermal bath containing the etch solution (not shown). The process temperature can range from about 1° C. to about 60° C., and is preferably about 20° C. to about 40° C. Generally, the etch solution provides an etch rate of the metal silicide at about 1 to about 10 angstroms/minute, or higher.

Figure 2:
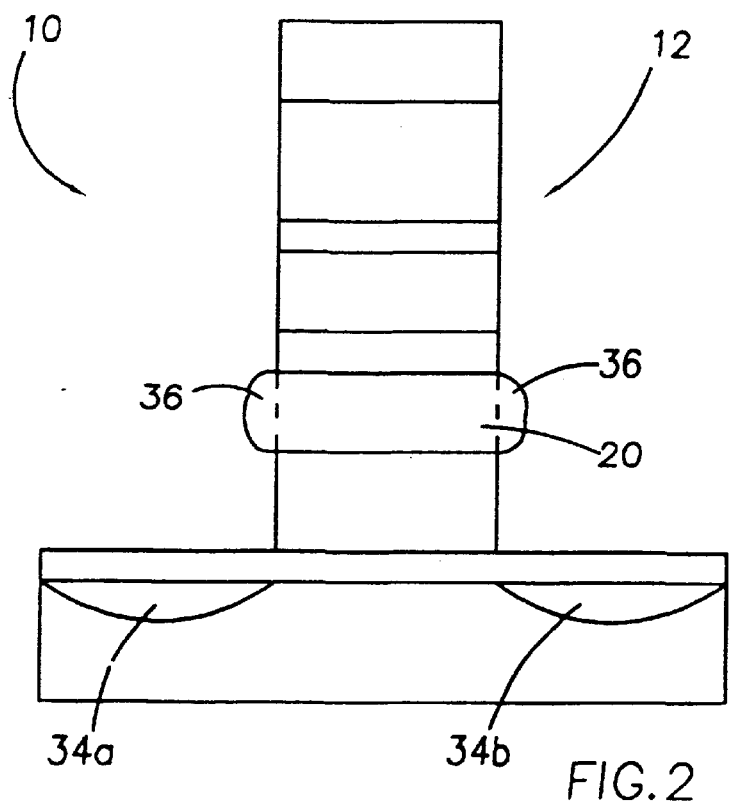
FIG. 2 is a view of the gate stack of FIG. 1 at subsequent processing step, showing the formation of "mouse ear" structures by lateral growth of the metal silicide layer during an oxidation processing step.
Figure 3B:
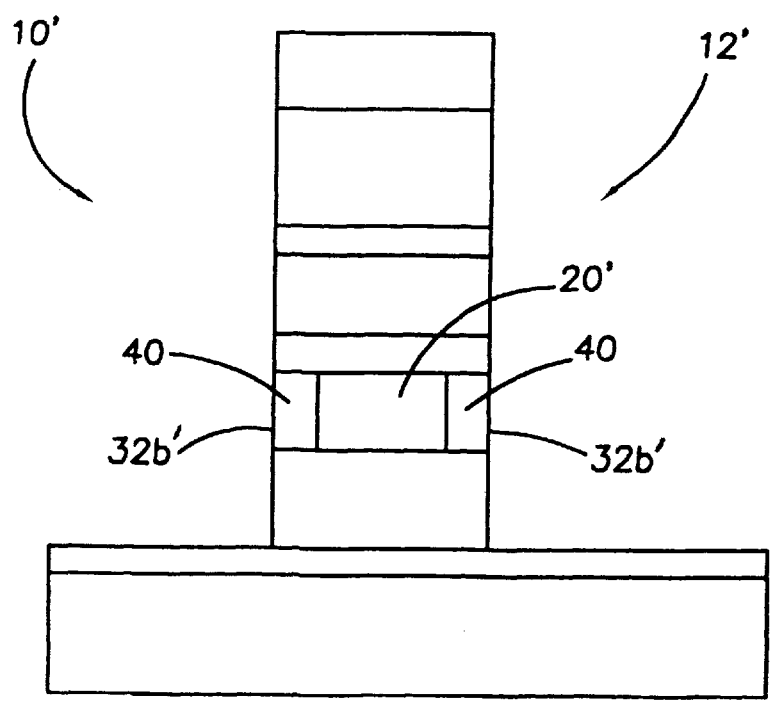

In processing a typical gate stack structure 10' to form the inset 38, it is desirable to continue the etch for a time period effective to remove up to about 100 angstroms of the metal silicide layer 20'. The size of the inset 38 is sufficient such that, in a subsequent oxidation step, oxidation of the metal silicide will form a fill portion 40 in the inset so that the sidewall 32b' of the metal silicide layer 20' is about even (i.e., flush) with the sidewalls of the other gate layers as shown in FIG. 3B, with substantially no lateral growth 36 of the metal silicide layer extending outward from the sidewalls of the gate stack (FIG. 2). Thus, by eliminating the "mouse ears" effect in a metal silicide gate layer, the invention particularly enables the use of tungsten silicide in a tungsten gate stack to achieve known transistor performance together with the lower resistance of tungsten.

Figure 4A:
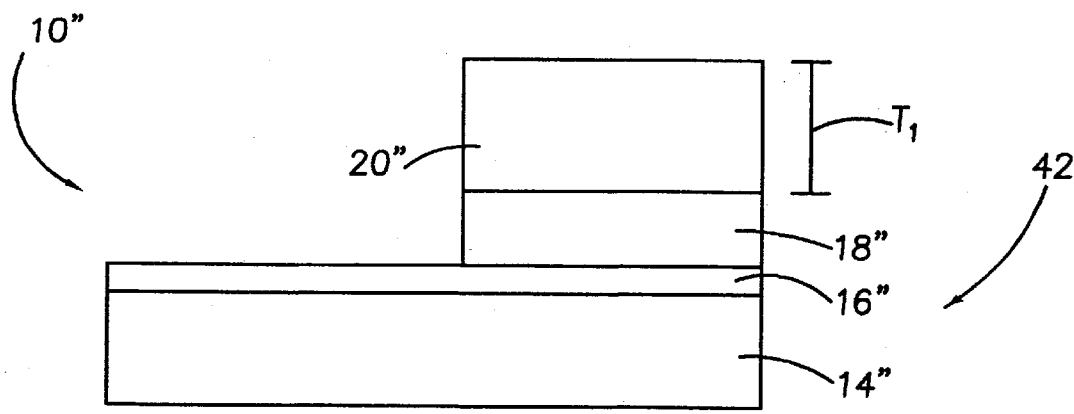
FIGS. 4A–4B are views of the gate stack of FIG. 1 at subsequent and sequential processing steps according to another embodiment of the method of the invention.
Figure 4B:
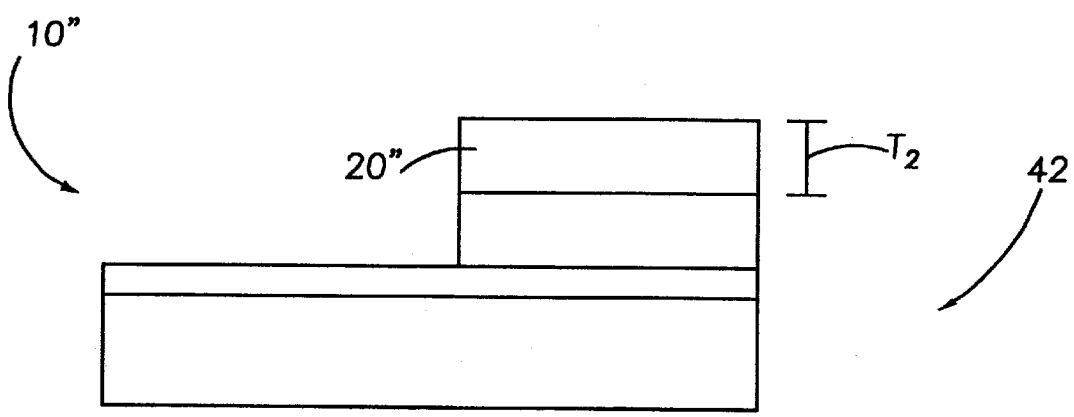

Referring to FIGS. 4A–4B, in another embodiment, the method can be used to selectively etch a portion of metal silicide in a layered structure 42. As shown in FIG. 4A, an exemplary wafer fragment 10" comprises a silicon substrate 14", an overlying $SiO_2$ layer 16", a doped polysilicon layer 18", and a metal (tungsten) silicide layer 20" having a first thickness $T_1$. The etch solution can be applied as previously desired, by means of a spray or bath, or other conventional means, under the described process conditions, to etch the metal silicide layer 20", resulting in the structure shown in FIG. 4B, whereby the metal silicide layer has a second thickness $T_2$, being less than thickness $T_1$. Although not shown, the metal silicide layer 20" can also be completely removed to expose the underlying oxide and/or polysilicon layers 14", 16". In the etching of the metal silicide layer 20", the metal silicide layer is selectively etched at a rate that exceeds the etch rate of the polysilicon and oxide layers 14", 16". Exposed polysilicon and oxide layers are not substantially etched during the etching step. This is useful, for example, where a metal silicide layer is too thick for subsequent processing, or to replace the metal silicide layer with another material.

The method and etch solution is particularly useful where an oxidation is to be performed on a substrate comprising metal silicide and it is desired to maintain the metal silicide layer at a predetermined thickness. For example, as shown and described with respect to FIGS. 3A–3B, a metal silicide gate layer can be selectively etched according to the invention to provide an inset which, upon subsequent oxidation, will become filled with an oxide material such that the surface is flush or even with the exposed surfaces of the other layers of the gate, thus eliminating undesirable lateral growth or "mouse ears." In addition, a blanket layer of metal silicide can be selectively etched to remove a thickness, as described with respect to FIGS. 4A–4B, such that, in a subsequent oxidation step, the metal silicide will oxidize, thus increasing the layer to a predetermined thickness (not shown).

EXAMPLE

Etch solutions were prepared according to the invention as indicated below. Test wafers comprising separate layers of gate oxide, tungsten (W), tungsten silicide ($WSi_x$) and polysilicon, were submerged in the etch solutions, and etch rates of the layers were measured in angstroms per minute.

The blend consisted of a fluorine-containing chemical mixture adjusted to a pH greater than 7.5 to avoid etching off the gate oxide (about 40 angstroms of gate oxide exposed), and below 10 to avoid etching the polysilicon.

Stock solutions:

Ammonium fluoride ($NH_4F$)=40 wt. % in water.

Hydrogen peroxide ($H_2O_2$)=30 wt. % in water

Ammonium hydroxide ($NH_4OH$)=29 wt. % as $NH_3$ in water

The stock solutions were blended as follows: 30 liters $NH_4F$+700 ml $NH_4OH$+50 ml $H_2O_2$.

The processing temperature was 20° C. to 32° C.

The etch rates of the etch solutions are shown in the table below.

| Chemistry (parts) | Etch rates (angstroms/minute) | | |
|---|---|---|---|
| $NH_4F:NH_4OH:H_2O_2$ | W | $WSi_x$ | Polysilicon |
| 600:12:0 | N/A* | 0 | 0.1 |
| 600:12:1 | 2.4 | 2.2 | N/A* |
| 600:12:4 | 5 | 2.6 | N/A* |
| 600:12:6 | N/A* | 2.4 | 0 |
| 600:12:12 | 6.5 | 2.3 | N/A |
| 600:12:24 | N/A* | 3.4 | N/A* |

* N/A = optical thickness or electrical resistance measurements were not taken.

The results indicate that a tungsten etch is accelerated by addition of excess oxidizer while a tungsten silicide etch is relatively stable. Hence, tungsten silicide can be selectively removed if the oxidizer concentration is controlled to a low level.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An aqueous etch solution, comprising:
   one or more fluorine-comprising compounds and form about 0.001% up to about 2% by volume of one or more oxidizing agents, the solution having a pH of about 7 to about 10, the etch solution selective to etch metal silicide at a greater rate than oxides and polysilicons such that the oxides and polysilicons are not substantially etched.

2. The etch solution of claim 1, wherein the fluorine-comprising compound comprises ammonium fluoride, ammonium bifluoride, or a mixture thereof.

3. The etch solution of claim 1, wherein the fluorine-comprising compound includes nitrogen and a hydrocarbon group.

4. The etch solution of claim 1, wherein the etch solution has a selectivity of metal silicide to doped oxide of greater than about 10.

5. The etch solution of claim 1, comprising about 85% to about 99% by volume of an about 40 wt-% aqueous solution of the fluorine-comprising compound.

6. The etch solution of claim 1, wherein the oxidizer is selected from the group consisting of hydrogen peroxide, ozone, potassium iodate, nitric acid, sulfuric acid, ammonium nitrate, ceric ammonium nitrate, and mixtures thereof.

7. The etch solution of claim 1, further comprising a pH control agent.

8. The etch solution of claim 7, wherein the pH control agent comprises ammonium hydroxide, tetramethylammonium hydroxide, and mixtures thereof.

9. The etch solution of claim 7, wherein the pH control agent comprises a base containing nitrogen, a hydroxyl group, and a hydrocarbon group.

10. The etch solution of claim 1, wherein the pH control agent comprises an acid selected from the group consisting of hydrochloric acid, sulfuric acid, nitric acid, and phosphoric acid.

11. The etch solution of claim 1, wherein the pH is maintained at about 8 to about 9.

12. The etch solution of claim 1, whereby the solution has an etch rate for metal silicide of about two to about ten times the etch rate of the solution for polysilicon and oxide.

13. The etchant solution of claim 1, comprising about 85% to about 99% by volume of an about 40 wt-% aqueous solution of ammonium fluoride and less than about 2% by volume hydrogen peroxide.

14. An aqueous etch solution, comprising:
   about 85% to about 99% by volume of an about 40 wt-% aqueous solution of a fluorine-comprising compound selected from the group consisting of ammonium fluoride, ammonium bifluoride, and mixtures thereof;
   less than about 2% by volume of an oxidizer selected from the group consisting of hydrogen peroxide, ozone, potassium iodate, nitric acid, sulfuric acid, ammonium nitrate, ceric ammonium nitrate, and mixtures thereof; and
   a pH control agent to maintain the pH of the solution at about 7 to about 10, whereby the etch solution is selective to etch metal suicide at a greater rate than oxides and polysilicons such that the oxides and polysilicons are not substantially etched.

15. An aqueous etch solution, comprising:
   about 85% to about 99% by volume of an about 40 wt-% aqueous solution of a fluorine-comprising compound including nitrogen and a hydrocarbon group;

less than about 2% by volume of an oxidizer selected from the group consisting of hydrogen peroxide, ozone, potassium iodate, nitric acid, sulfuric acid, ammonium nitrate, ceric ammonium nitrate, and mixtures thereof; and a pH control agent to maintain the pH of the solution at about 7 to about 10, whereby the etch solution is selective to etch metal silicide at a greater rate than oxides and polysilicons such that the oxides and polysilicons are not substantially etched.

16. An aqueous etch solution, comprising:

comprising about 85% to about 99% by volume of an about 40 wt-% aqueous solution of ammonium fluoride, less than about 2% by volume hydrogen peroxide, and a pH control agent to maintain the pH of the solution at about 7 to about 10, whereby the etch solution is selective to etch metal silicide at a greater etch rate than oxides and polysilicons such that oxides and polysilicons are not substantially etched.

17. The etch solution of claim 16, further comprising a stabilizing agent.

18. The etch solution of claim 16, further comprising a surfactant.

19. A method for etching a surface having exposed metal silicide on a semiconductor substrate, comprising the step of:

exposing the surface to an aqueous solution comprising one or more fluorine-comprising compounds, one or more oxidizers, and one or more pH control agents to maintain the solution at about pH 7 to about 10 to selectively etch the metal silicide and not substantially etch oxides and polysilicons.

20. The method of claim 19, wherein the step of exposing comprises selectively etching the metal silicide at about two to about ten times the etch rate at which the solution etches oxides and polysilicons.

21. The method of claim 19, wherein the step of exposing comprises selectively etching the metal silicide at a rate of about 1 to about 10 angstroms/minute and about two to about ten times the etch rate for oxides and polysilicons.

22. The method of claim 19, wherein the metal silicide comprises tungsten silicide.

23. The method of claim 19, wherein the solution comprises a fluorine-comprising compound of the solution selected from the group consisting of ammonium fluoride, ammonium bifluoride, and mixtures thereof.

24. The method of claim 19, wherein the fluorine-comprising compound of the solution contains nitrogen and a hydrocarbon group.

25. The method of claim 19, wherein the solution has a selectivity of metal silicide to doped oxide of greater than about 10.

26. The method of claim 19, wherein the solution comprises about 85% to about 99% by volume of an about 40 wt-% aqueous solution of the fluorine-comprising compound.

27. The method of claim 19, wherein the oxidizer is selected from the group consisting of hydrogen peroxide, ozone, potassium iodate, nitric acid, sulfuric acid, ammonium nitrate, ceric ammonium nitrate, and mixtures thereof.

28. The method of claim 19, wherein the solution comprises about 0.001% up to about 2% by volume of the oxidizer.

29. The method of claim 19, wherein the pH control agent is selected from the group consisting of ammonium hydroxide, tetramethylammonium hydroxide, a base containing nitrogen, a hydroxyl group and a hydrocarbon group, and mixtures thereof.

30. The method of claim 19, wherein the pH control agent comprises a base containing nitrogen, a hydroxyl group and a hydrocarbon group.

31. The method of claim 19, wherein the pH is maintained at about 8 to about 9.

32. The method of claim 19, wherein the solution comprises about 85% to about 99% by volume of an about 40 wt-% aqueous solution of ammonium fluoride and less than about 2% by volume hydrogen peroxide.

33. A method for treating a layered substrate comprising a layer of metal suicide, comprising the step of:

exposing the layered substrate to an aqueous solution comprising a major amount of one or more fluorine-comprising compounds, a minor amount of an oxidizer, and a pH control agent to maintain the pH of the solution at about 7 to about 10, whereby the solution is formulated to selectively etch the metal silicide and not substantially etch oxides and polysilicons.

34. The method of claim 33, wherein the layered structure further comprises at least one of an oxide layer, and a polysilicon layer.

35. The method of claim 33, wherein the layered structure is a gate stack, and the metal silicide is etched to form an inset in the metal silicide layer.

36. The method of claim 34, wherein the metal silicide is etched at about two to about ten times the rate at which the solution etches the oxide layer and the polysilicon layer.

37. The method of claim 33, wherein the metal silicide comprises tungsten silicide.

38. The method of claim 33, wherein the solution comprises water, about 85% to about 99% by volume of an about 40 wt-% aqueous solution of ammonium fluoride, less than about 2% by volume hydrogen peroxide, and a pH control agent to maintain the solution at a pH of about 8 to about 9.

39. A method for treating a layered substrate comprising a layer of metal silicide, comprising the step of:

exposing the layered substrate to an aqueous solution comprising a major amount of a fluorine-comprising compound selected from the group consisting of ammonium fluoride, ammonium bifluoride, and mixtures thereof, a minor amount of an oxidizer selected from the group consisting of hydrogen peroxide, ozone, potassium iodate, nitric acid, sulfuric acid, ammonium nitrate, ceric ammonium nitrate, and mixtures thereof, and a pH control agent to maintain the pH of the solution at about 7 to about 10, whereby the solution selectively etches the metal silicide and does not substantially etch oxides and polysilicons.

40. A method for treating a layered substrate comprising a layer of metal silicide, comprising the step of:

exposing the layered substrate to an aqueous solution comprising a major amount of a fluorine-comprising compound containing nitrogen and a hydrocarbon group; an oxidizer selected from the group consisting of hydrogen peroxide, ozone, potassium iodate, nitric acid, sulfuric acid, ammonium nitrate, ceric ammonium nitrate, and mixtures thereof; and a pH control agent to maintain the pH of the solution at about 7 to about 10, whereby the solution etches the metal silicide and does not substantially etch oxide or polysilicon.

41. A method for treating a surface of a layered structure formed on a semiconductor substrate, the structure comprising a layer of metal silicide and one or more layers of a non-metal silicide, each of the layers having an exposed surface; the method comprising the step of:

exposing the surface of the layers to an aqueous solution selective to etch the metal silicide at a higher etch rate than oxides and polysilicon such that the solution selectively etches the metal silicide at a rate of up to about 10 angstroms/minute and the exposed surfaces of oxides and polysilicons are not substantially etched; the solution comprising one or more fluorine-comprising compounds and one or more oxidizing agents, and having a pH of about 7 to about 10.

42. The method of claim 41, wherein the aqueous solution comprises about 85% to about 99% by volume of an about 40 wt-% aqueous solution of ammonium fluoride and less than about 2% by volume hydrogen peroxide.

43. The method of claim 41, wherein the pH of the solution is about 7 to about 10.

44. The method of claim 41, wherein the solution further comprises a pH control agent to maintain the pH at about 8 to about 9.

45. The method of claim 41, wherein the step of exposing comprises removing the metal silicide at up to about 10 times the rate at which the solution removes oxides and polysilicons.

46. A method for forming a gate stack and a source/drain region on a semiconductor substrate, comprising the steps of:
providing a silicon substrate having an etched, layered gate stack formed thereon, the gate stack comprising a layer of metal silicide having an exposed surface;
exposing the metal silicide layer to an aqueous solution comprising one or more fluorine-comprising compounds, one or more oxidizers, and one or more pH control agents to maintain the solution at about pH 7 to about 10; whereby the solution etches the metal silicide at a rate that exceeds etching of an oxide and polysilicon, and does not substantially etch the oxide or polysilicon;
oxidizing the silicon substrate to form an oxide layer thereon, and within the inset of the metal silicide layer to substantially fill the inset; and
doping the silicon substrate to form the source/drain regions.

47. A method for forming an inset in a layer of metal silicide in a gate stack, comprising the steps of:
providing a silicon substrate having a gate stack formed thereon, the gate stack comprising a layer of polysilicon and a layer of metal silicide, each of the layers having an exposed surface; and
exposing the surface of the layers to an aqueous solution having an etch rate for the metal silicide exceeding the etch rate of the polysilicon, the solution comprising a fluorine-comprising compound, an oxidizer and a pH control agent, the solution having a pH of about 7 to about 10; whereby the metal silicide layer is etched to form the inset in the surface of the layer, and the exposed surface of the polysilicon layer is not substantially etched.

48. A method for forming an inset in a layer of metal silicide in a gate stack, comprising the steps of:
providing a silicon substrate having a gate stack formed thereon, the gate stack comprising a layer of metal silicide and at least one layer comprising a non-metal silicide material selected from the group consisting of silicon dioxide, polysilicon, metal nitride, conductive metal, low silane oxide, and silicon nitride, each of the layers having an exposed surface; and
exposing the surface of the layers to an aqueous solution having a higher etch rate for the metal silicide than the non-metal silicide layers, the solution comprising a fluorine-comprising compound, an oxidizer, and a pH control agent to maintain the pH at about 7 to about 10; whereby the metal silicide layer is etched to form the inset in the layer, and the exposed surfaces of the non-metal silicide layers are not substantially etched.

49. The method of claim 48, wherein the metal silicide is tungsten silicide, and the gate stack comprises a layer of silicon dioxide and a layer of doped polysilicon.

50. The method of claim 49, wherein the layer of tungsten silicide is interposed between the layer of doped polysilicon and a layer of tungsten nitride, with a layer of tungsten overlying the tungsten nitride layer.

51. The method of claim 48, wherein the gate stack comprises sequential layers of silicon dioxide, doped polysilicon, metal silicide, metal nitride, and conductive metal.

52. A method for treating a structure formed on a semiconductor substrate, the structure comprising a layer of polysilicon and a layer of metal silicide, comprising the steps of:
performing an etch upon the structure to expose a surface of the polysilicon layer and a surface of the metal silicide layer; and
exposing the exposed surfaces of the polysilicon layer and the metal silicide layer to an aqueous solution selective to etch the metal silicide at an etch rate of up to about 10 angstroms/minute, the etch rate being higher than the etch rate for the polysilicon; wherein the solution comprises water, about 85% to about 99% by volume of an about 40 wt-% aqueous solution of a fluorine-comprising compound selected from the group consisting of ammonium fluoride, ammonium bifluoride, and mixtures thereof, less than about 2% by volume of an oxidizer selected from the group consisting of hydrogen peroxide, ozone, potassium iodate, nitric acid, sulfuric acid, ammonium nitrate, ceric ammonium nitrate, and mixtures thereof, and a pH control agent to maintain the solution at a pH of about 7 to about 10; whereby an inset is etched into the exposed surface of the metal silicide layer, and the exposed surface of the polysilicon layer is not substantially etched.

53. A method for treating a structure formed on a semiconductor substrate, the structure comprising a layer of polysilicon and a layer of metal silicide, comprising the steps of:
performing an etch upon the structure to expose a surface of the polysilicon layer and a surface of the metal silicide layer; and
exposing the exposed surfaces of the polysilicon layer and the metal silicide layer to an aqueous solution selective to etch the metal silicide at an etch rate of up to about 10 angstroms/minute, the etch rate being higher than the etch rate for the polysilicon; wherein the solution comprises water, about 85% to about 99% by volume of an about 40 wt-% aqueous solution of a fluorine-comprising compound containing nitrogen and a hydrocarbon group, less than about 2% by volume of an oxidizer selected from the group consisting of hydrogen peroxide, ozone, potassium iodate, nitric acid, sulfuric acid, ammonium nitrate, ceric ammonium nitrate, and mixtures thereof, and a pH control agent to maintain the solution at a pH of about 7 to about 10; whereby an inset is etched into the exposed surface of the metal silicide layer, and the exposed surface of the polysilicon layer is not substantially etched.

54. A method for treating a structure formed on a semiconductor substrate, the structure comprising a layer of polysilicon and a layer of metal silicide, comprising the steps of:

performing an etch upon the structure to expose a surface of the polysilicon layer and a surface of the metal silicide layer; and selectively etching an inset into the exposed surface of the metal silicide layer by exposing the exposed surfaces of the polysilicon layer and the metal silicide layer to an aqueous solution selective to etch the metal silicide at a rate higher than the etch rate of the solution for the polysilicon, wherein the solution comprises water, about 85% to about 99% by volume of an about 40 wt-% aqueous solution of ammonium fluoride and less than about 2% by volume hydrogen peroxide, and a pH control agent to maintain the solution at a pH of about 7 to about 10; whereby the exposed surface of the polysilicon layer is not substantially etched.

55. The method of claim 54, further comprising, after the step of selectively etching the inset, the step of performing an oxidation processing on the structure whereby the metal silicide is oxidized to fill the inset and form an exposed oxidized surface.

56. The method of claim 55, whereby the exposed oxidized surface of the metal silicide layer is about flush with the exposed surface of the polysilicon layer.

57. A method for treating a semiconductor substrate comprising a gate oxide layer, an overlying polysilicon layer, and an overlying metal silicide layer, the method comprising the steps of:

performing an etch upon the semiconductor substrate to expose a surface of the gate oxide layer, a surface of the polysilicon layer and a surface of the metal silicide layer; and exposing the exposed surfaces of the gate oxide layer, the polysilicon layer and the metal silicide layer to an aqueous solution selective to etch the metal silicide at an etch rate higher than the etch rate for the gate oxide and the polysilicon, wherein the solution comprises water, about 85% to about 99% by volume of an about 40 wt-% aqueous solution of ammonium fluoride and less than about 2% by volume hydrogen peroxide, and a pH control agent to maintain the solution at a pH of about 7 to about 10, whereby an inset is selectively etched into the exposed surface of the metal silicide layer, and the exposed surfaces of the gate oxide layer and the polysilicon layer are not substantially etched.

58. A method of etching a metal silicide layer in the presence of a polysilicon layer and an oxide layer, comprising the step of:

applying an aqueous etch solution to selectively etch the metal silicide layer at an etch rate of up to about 10 angstroms/minute and not substantially etch the polysilicon and oxide layers, whereby the etch solution comprises a fluorine-comprising compound, an oxidizing agent, and a pH control agent to maintain the pH of the etch solution at about 7 to about 10; the solution selective to etch the metal silicide at a greater etch rate than the polysilicon and the oxide layers.

59. The method of claim 58, wherein the solution comprises ammonium fluoride and hydrogen peroxide.

60. A method of etching a metal silicide layer in the presence of a polysilicon layer and an oxide layer, comprising the step of:

applying an aqueous etch solution to selectively etch the metal silicide layer, whereby the etch solution comprises a fluorine-comprising compound selected from the group consisting of ammonium fluoride, ammonium bifluoride, and mixtures thereof, and up to about 2% by volume of an oxidizer selected from the group consisting of hydrogen peroxide, ozone, potassium iodate, nitric acid, sulfuric acid, ammonium nitrate, ceric ammonium nitrate, and mixtures thereof; the etch solution having a pH of about 7 to about 10; whereby the metal silicide layer is selectively etched at a rate exceeding the rate of the polysilicon and the oxide, and the polysilicon and the oxide are not substantially etched.

61. A method of etching a metal silicide layer in the presence of a polysilicon layer and an oxide layer, comprising the step of:

applying an aqueous etch solution to selectively etch the metal silicide layer, whereby the etch solution comprises a fluorine-comprising compound containing nitrogen and a hydrocarbon group, and up to about 2% by volume of an oxidizer selected from the group consisting of hydrogen peroxide, ozone, potassium iodate, nitric acid, sulfuric acid, ammonium nitrate, ceric ammonium nitrate, and mixtures thereof; the etch solution having a pH of about 7 to about 10; whereby the metal silicide layer is selectively etched at a rate exceeding the rate of the polysilicon and the oxide, and the polysilicon and the oxide are not substantially etched.

62. A method of etching a metal silicide layer in the presence of a polysilicon layer and an oxide layer, comprising the step of:

applying an aqueous etch solution to selectively etch the metal silicide layer, whereby the etch solution comprises ammonium fluoride and up to about 2% by volume hydrogen peroxide in an aqueous solution, the etch solution having a pH of about 7 to about 10; whereby the metal silicide layer is selectively etched at a rate exceeding the etch rate of the polysilicon and the oxide, and the polysilicon and the oxide are not substantially etched.

63. The method of claim 62, wherein the etch solution further comprises a pH control agent.

64. The method of claim 63, wherein the pH control agent is selected from the group consisting of ammonium hydroxide, tetramethylammonium hydroxide, a base containing nitrogen, a hydroxyl group and a hydrocarbon group, and mixtures thereof.

65. The method of claim 62, wherein the etch solution has a pH of about 8 to about 9.

66. A method of etching a metal silicide layer in the presence of a polysilicon layer and an oxide layer, comprising the step of:

applying an etch solution selective to the metal silicide layer, whereby the metal silicide layer is selectively etched at a rate exceeding the rate of the polysilicon layer and the oxide layer; the etch solution comprising about 85% to about 99% by volume of an about 40 wt-% solution of ammonium fluoride and less than about 2% by volume hydrogen peroxide, and ammonium hydroxide to maintain the solution at a pH of about 7 to about 10.

67. A method of forming a gate stack and a source/drain region on a semiconductor substrate, comprising the steps of:

providing a silicon substrate having a gate stack formed thereon, the gate stack including a metal silicide layer and at least one non-metal silicide layer;

applying an aqueous etch solution to the gate stack, whereby the metal silicide layer is etched at a rate exceeding the rate of the non-metal silicide layer to form an inset in the metal silicide layer, and the non-metal silicide layer is not substantially etched; the etch solution comprising a fluorine-comprising compound selected from the group consisting of ammonium fluoride, ammonium bifluoride, and mixtures thereof; up to about 2% by volume of an oxidizer selected from the group consisting of hydrogen peroxide, ozone, potassium iodate, nitric acid, sulfuric acid, ammonium nitrate, ceric ammonium nitrate, and mixtures thereof; and a pH control agent selected from the group consisting of ammonium hydroxide, tetramethylammonium hydroxide, a base containing nitrogen, a hydroxyl group and a hydrocarbon group, and mixtures thereof; the solution having a pH of about 7 to about 10;

applying an oxidizing agent to the silicon substrate to form an oxide layer thereon, whereby the metal silicide layer is oxidized to form an oxide fill in the inset in the metal silicide layer; and forming source/drain regions by ion implantation of the silicon layer with a doping agent.

68. A method of forming a gate stack and a source/drain region on a semiconductor substrate, comprising the steps of:

providing a silicon substrate having a gate stack formed thereon, the gate stack including a metal silicide layer and at least one non-metal silicide layer;

applying an aqueous etch solution to the gate stack, whereby the metal silicide layer is etched at a rate exceeding the rate of the non-metal silicide layer to form an inset in the metal silicide layer, and the non-metal silicide layer is not substantially etched; the etch solution comprising a fluorine-comprising compound containing nitrogen and a hydrocarbon group; up to about 2% by volume of an oxidizer selected from the group consisting of hydrogen peroxide, ozone, potassium iodate, nitric acid, sulfuric acid, ammonium nitrate, ceric ammonium nitrate, and mixtures thereof; and a pH control agent selected from the group consisting of ammonium hydroxide, tetramethylammonium hydroxide, a base containing nitrogen, a hydroxyl group, and a hydrocarbon group; and mixtures thereof, the solution having a pH of about 7 to about 10;

applying an oxidizing agent to the silicon substrate to form an oxide layer thereon, whereby the metal silicide layer is oxidized to form an oxide fill in the inset in the metal silicide layer; and forming source/drain regions by ion implantation of the silicon layer with a doping agent.

69. A method of forming a gate stack and a source/drain region on a semiconductor substrate, comprising the steps of:

providing a silicon substrate having a gate stack formed thereon, the gate stack including a metal silicide layer and at least one non-metal silicide layer;

applying an etch solution to the gate stack, whereby the metal silicide layer is etched at a rate exceeding the rate of the non-metal silicide layer to form an inset in the metal silicide layer, and the non-metal silicide layer is not substantially etched; the etch solution comprising ammonium fluoride, up to about 2% by volume hydrogen peroxide, and ammonium hydroxide in an aqueous solution having a pH of about 7 to about 10;

applying an oxidizing agent to the silicon substrate to form an oxide layer thereon, whereby the metal silicide layer is oxidized to form an oxide fill in the inset in the metal silicide layer; and forming source/drain regions by ion implantation of the silicon layer with a doping agent.

70. A method of forming a gate stack and a source/drain region on a semiconductor substrate, comprising the steps of:

providing a semiconductor substrate having a silicon base layer, a dielectric layer on an active surface of the silicon base layer, a polysilicon layer disposed over the dielectric layer, and a metal silicide layer disposed over the polysilicon layer;

applying an etch solution to the metal silicide layer, whereby the metal silicide layer is etched at a rate exceeding the rate of the dielectric and the polysilicon to form an inset in the metal silicide layer, and the dielectric layer and the polysilicon layer are not substantially etched; the etchant comprising ammonium fluoride, up to about 2% by volume hydrogen peroxide, and ammonium hydroxide in an aqueous solution, whereby the etch solution has a pH of about 7 to about 10;

applying an oxidizing agent to the silicon substrate to form an oxide layer thereon, whereby the metal silicide layer is oxidized to form an oxide fill in the inset in the metal silicide layer; and forming source/drain regions by ion implantation of the silicon layer with a doping agent.

71. The method of claim 70, wherein the ion implantation comprises doping with a dopant selected from the group consisting of phosphorus, arsenic, and boron.

72. An aqueous etch solution, comprising:

one or more fluorine-comprising compounds containing nitrogen and a hydrocarbon group, and one or more oxidizing agents, the solution having a pH of about 7 to about 10, the etch solution selective to etch metal silicide at a greater rate than oxides and polysilicons such that the oxides and polysilicons are not substantially etched.

73. An aqueous etch solution, comprising:

one or more fluorine-comprising compounds, one or more oxidizing agents, and a pH control agent comprising a base containing nitrogen, a hydroxyl group and a hydrocarbon group, the solution having a pH of about 7 to about 10, the etch solution selective to etch metal silicide at a greater rate than oxides and polysilicons such that the oxides and polysilicons are not substantially etched.

74. A method for etching a surface having exposed metal silicide on a semiconductor substrate, comprising the step of:

exposing the surface to an aqueous solution comprising one or more fluorine-comprising compounds containing nitrogen and a hydrocarbon group, one or more oxidizers, and one or more pH control agents to maintain the solution at about pH 7 to about 10 to selectively etch the metal silicide and not substantially etch oxides and polysilicons.

75. A method for etching a surface having exposed metal silicide on a semiconductor substrate, comprising the step of:

exposing the surface to an aqueous solution comprising one or more fluorine-comprising compounds, one or more oxidizers, and one or more pH control agents to maintain the solution at about pH 7 to about 10 to selectively etch the metal silicide and not substantially etch oxides and polysilicons, wherein the pH control agent is selected from the group consisting of ammonium hydroxide, tetramethylammonium hydroxide, a base containing nitrogen, a hydroxyl group and a hydrocarbon group, and mixtures thereof.

76. A method for etching a surface having exposed metal silicide on a semiconductor substrate, comprising the step of:

exposing the surface to an aqueous solution comprising one or more fluorine-comprising compounds, one or more oxidizers, and one or more pH control agents to maintain the solution at about pH 7 to about 10 to selectively etch the metal silicide and not substantially etch oxides and polysilicons, wherein the pH control agent comprises a base containing nitrogen, a hydroxyl group and a hydrocarbon group.

77. A method for treating a structure formed on a semiconductor substrate, the structure comprising a layer of polysilicon and a layer of metal silicide, comprising the steps of:

performing an etch upon the structure to expose a surface of the polysilicon layer and a surface of the metal silicide layer;

selectively etching an inset into the exposed surface of the metal silicide layer by exposing the exposed surfaces of the polysilicon layer and the metal silicide layer to an aqueous solution selective to etch the metal silicide at a rate higher than the etch rate of the solution for the polysilicon, wherein the solution comprises water, about 85% to about 99% by volume of an about 40 wt-% aqueous solution of ammonium fluoride and less than about 2% by volume hydrogen peroxide, and a pH control agent to maintain the solution at a pH of about 7 to about 10; whereby the exposed surface of the polysilicon layer is not substantially etched; and performing an oxidation processing on the structure whereby the metal silicide is oxidized to fill the inset and form an exposed oxidized surface.

78. A method for treating a structure formed on a semiconductor substrate, the structure comprising a layer of polysilicon and a layer of metal silicide, comprising the steps of:

performing an etch upon the structure to expose a surface of the polysilicon layer and a surface of the metal silicide layer;

selectively etching an inset into the exposed surface of the metal silicide layer by exposing the exposed surfaces of the polysilicon layer and the metal silicide layer to an aqueous solution selective to etch the metal silicide at a rate higher than the etch rate of the solution for the polysilicon, wherein the solution comprises water, about 85% to about 99% by volume of an about 40 wt-% aqueous solution of ammonium fluoride and less than about 2% by volume hydrogen peroxide, and a pH control agent to maintain the solution at a pH of about 7 to about 10; whereby the exposed surface of the polysilicon layer is not substantially etched;

performing an oxidation processing on the structure whereby the metal silicide is oxidized to fill the inset and form an exposed oxidized surface about flush with the exposed surface of the polysilicon layer.

79. A method of etching a metal silicide layer in the presence of a polysilicon layer and an oxide layer, comprising the step of:

applying an aqueous etch solution to selectively etch the metal silicide layer, whereby the etch solution comprises ammonium fluoride, up to about 2% by volume hydrogen peroxide in an aqueous solution, and a pH control agent selected from the group consisting of ammonium hydroxide, tetramethylammonium hydroxide, a base containing nitrogen, a hydroxyl group and a hydrocarbon group, and mixtures thereof; the etch solution having a pH of about 7 to about 10; whereby the metal silicide layer is selectively etched at a rate exceeding the etch rate of the polysilicon and the oxide, and the polysilicon and the oxide are not substantially etched.

80. A method for etching a metal silicide layer, comprising the step of:

exposing the metal silicide layer to an aqueous solution comprising one or more fluorine-comprising compounds and from about 0.001% up to about 2% by volume of one or more oxidizing agents, the solution having a pH of about 7 to about 10, to selectively etch the metal silicide and not substantially etch oxide and polysilicon.

* * * * *

UNITED STATES PATENT AND TRADEMARK OFFICE
CERTIFICATE OF CORRECTION

PATENT NO. : 6,589,884 B1
DATED : July 8, 2003
INVENTOR(S) : Kevin J. Torek

It is certified that error appears in the above-identified patent and that said Letters Patent is hereby corrected as shown below:

Column 1,
Line 21, replace "suicides" with -- silicides --.
Line 40, replace "suicides" with -- silicides --.

Column 6,
Line 61, replace "suicide" with -- silicide --.

Column 8,
Line 11, replace "suicide" with -- silicide --.

Signed and Sealed this

Ninth Day of September, 2003

JAMES E. ROGAN
*Director of the United States Patent and Trademark Office*